Aug. 14, 1962
H. P. BROCKMAN
TRANSISTOR CIRCUIT FOR GENERATING CONSTANT AMPLITUDE WAVE SIGNALS
Filed Oct. 31, 1960
3,049,625
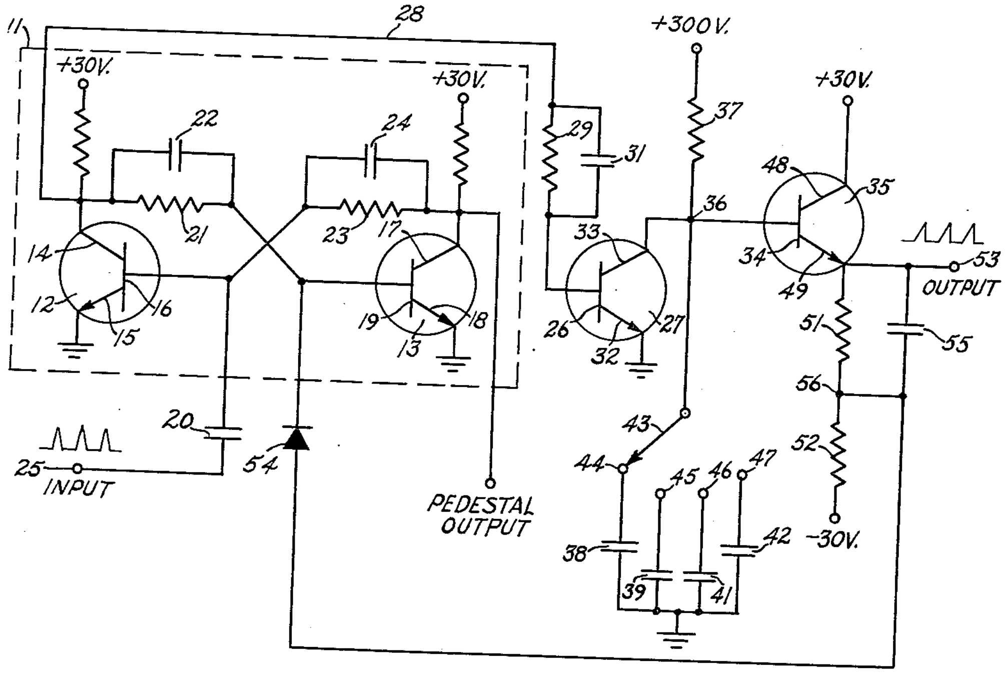
INVENTOR.
HERBERT P. BROCKMAN
BY
H. H. Losche
Paul S. Collignon
ATTORNEYS United States Patent Office 3,049,625

Patented Aug. 14, 1962

3,049,625 TRANSISTOR CIRCUIT FOR GENERATING CONSTANT AMPLITUDE WAVE SIGNALS

Herbert Philip Brockman, Moorestown, N.J., assignor, by mesne assignments, to the United States of America as represented by the Secretary of the Navy Filed Oct. 31, 1960, Ser. No. 66,370
6 Claims. (Cl. 307—88.5)

The present invention relates to triggered electronic circuits and more particularly to a transistor circuit for generating a time base or sawtooth signal wave for use as a range sweep generator in a radar system.

One heretofore known method of developing a sawtooth signal wave is by the use of a relaxation type of signal generator wherein a capacitor is charged through one current path of relatively high resistance and discharged through an electronic device. However, this type of circuit does not provide a high degree of stability and additional complicated circuitry is required to provide the necessary degree of stability.

In the present invention, the sawtooth amplitude remains constant throughout various range switching positions and the timing of the waveform is independent of any active elements in the circuit. The desired precision in timing is determined by the precision of a single RC time constant.

First and second transistors are provided and are connected with associated components to form a conventional flip-flop. A third transistor is provided which, upon application of a trigger input to the flip-flop, is rapidly cut off and is then held at cutoff. The collector voltage of the third transistor rises exponentially at a rate determined by the value of an RC time constant, which can be varied by switching to different values of capacitance. The signal from the third transistor is direct coupled through an emitter follower to provide a low impedance output. A portion of the signal is fed back through an integrator to the flip-flop, in order to compensate for changes in trigger requirements at the base of the second transistor in the flip-flop due to the difference in slope for the generated sawtooth. In this way the amplitude of the generated sawtooth is held constant.

It is therefore a general object of the present invention to provide an improved circuit for generating a sawtooth signal wave.

Another object of the present invention is to provide a circuit for generating a sawtooth signal wave having constant amplitude.

Another object of the present invention is to provide a signal generator which provides precision in timing by a single RC time constant.

Still another object of the present invention is to provide a circuit having a minimum of active elements for generating a sawtooth wave signal.

Other objects and advantages of the present invention will be readily appreciated as the same becomes better understood by reference to the following detailed description when considered in connection with the accompanying drawing which is a schematic circuit diagram of a preferred embodiment of the present invention.

Referring now to the drawing, a flip-flop circuit 11 is shown having two junction type transistors 12 and 13. The collector 14 of transistor 12 is cross-connected to base 19 of transistor 13 through resistor 21 and capacitor 22, and likewise, the collector 17 of transistor 13 is cross-connected to base 16 of transistor 12 through resistor 23 and capacitor 24. The collector electrodes 14 and 17 are each connected to a voltage source, and the emitter electrodes 15 and 18 are connected to ground potential. Input terminal 25 is connected to base electrode 16 of transistor 12 to apply a pulse that causes transistor 12 to be driven to saturation, and transistor 13 to be cut off, as in a conventional flip-flop circuit.

The output of flip-flop 11 is applied to the base 26 of transistor 27 by means of lead 28 and through resistor 29 and speed up capacitor 31. Emitter 32 of transistor 27 is connected to ground potential and collector 33 is connected to base 34 of transistor 35 through junction point 36. The collector voltage of transistor 27 rises exponentially at a rate determined by resistor 37 and one of capacitors 38, 39, 41, or 42, that is selected by means of switch 43. As can be seen, resistor 37 has one end connected to junction point 36, and the other end is connected to a positive voltage source. Capacitors 38 through 42 each have one end connected to ground potential and each have the other ends connected, respectively, to terminals 44, 45, 46, and 47.

Transistor 35, which acts as an emitter follower, has its base 34 connected to junction point 36. Collector 48 of transistor 35 is connected to a positive voltage source and emitter 49 is connected to a negative source through resistors 51 and 52. Output terminal 53 is connected to emitter 49, and a portion of the output signal is fed back to flip-flop 11 through diode 54 and capacitor 55 which operates as an integrator.

In operation, before the application of a positive pulse at input terminal 25, transistor 13 is in saturation as transistor 12 is cut off, and consequently, base current is supplied to transistor 27 through resistor 29 to hold transistor 27 in saturation. Consequently, collector 33 of transistor 27 is at zero potential and the circuit is at rest.

Upon the application of a trigger pulse at input terminal 25, transistor 12 is driven to saturation and transistor 13 is cut off, as in a conventional flip-flop circuit. After the trigger pulse subsides, transistor 13 is held in saturation by base current supplied through resistor 17 so that the collector 14 of transistor 12 is at zero potential. As collector 14 goes negative upon the application of the initial trigger pulse, a negative pulse is applied to base 26 of transistor 27 through speed up capacitor 31 so that transistor 27 is rapidly cut off. After the initial surge, transistor 27 is held at cutoff because there is no voltage across resistor 29, as transistor 12 is in saturation. Collector 33 of transistor 27 therefore rises exponentially at a rate determined by the value of the RC time constant comprised of resistor 37 and a selected capacitor from the group 38, 39, 41, and 42.

The signal from transistor 27 is direct coupled through transistor 35 to provide a low impedance output, and a portion of the signal is fed back to base 19 of transistor 13 through the coupling diode 54 and the voltage divider comprised of resistors 51 and 52. At the beginning of the sawtooth waveform, the potential at the junction 56, which is common to resistors 51 and 52, is negative so that diode 54 does not conduct. As the sawtooth rises in a positive direction, the potential at junction 56 rises until it has a positive potential of approximately one volt at which time diode 54 conducts strongly enough so that transistor 13 is driven to saturation causing the basic flip-flop to switch back to its initial rest position.

Capacitor 55 operates as an integrator which compensates for changes in trigger requirements at the base of transistor 13 due to the difference in slope of the sawtooth, which is provided for various ranges in a radar system. This integrating function of capacitor 55 maintains a constant amplitude of the sawtooth regardless of the position of switch 43 that selectively connects different capacitors.

When the basic flip-flop is switched back to its initial condition, transistor 27 is driven quickly into saturation by speed up capacitor 31 so that the timing capacitor that has been selected through switch 43 is quickly discharged.

The circuit then remains in a rest position until another trigger pulse is applied to input terminal 25.

In order to obtain precision in timing, transistor 27 is operated as a switch only, with a saturation potential of less than 100 millivolts, so that the starting potential of the sawtooth is essentially constant. Resistor 37 is small compared to the input impedance to emitter follower 35 and the collector leakage resistance of transistor 27. It can thus be seen that precision in timing is a function of the RC time constant and the tolerance of the supply voltage. The amplitude of the sawtooth signal wave is determined by the amount of feedback to transistor 13 and the bias to which resistor 52 is returned. By using precision resistors for resistors 51 and 52, and by using a close tolerance negative bias supply, precision amplitude control can be obtained.

The circuit disclosed herein has an additional feature in that a fast rising flat top square wave gate pulse, or pedestal, can be obtained from collector 17 of transistor 13.

It can thus be seen that the present invention provides an improved circuit for generating a sawtooth signal wave having constant amplitude.

Obviously, many modifications and variations of the present invention are possible in the light of the above teachings. It is therefore to be understood, that within the scope of the appended claims, the invention may be practiced otherwise than as specifically described.

What is claimed is:

1. An electrical circuit for selectively generating sawtooth signal waves having different slopes but same amplitudes comprising: a flip-flop circuit having an input terminal and at least one output terminal; first and second transistors, each having a control electrode and first and second conduction electrodes, said output terminal being connected to said control electrode of said first transistor, and said control electrode of said second transistor being connected to one conduction electrode of said first transistor; a timing resistor and a plurality of timing capacitors selectively connectable one each to said control electrode of said second transistor; an output terminal connected to one conduction electrode of said second transistor; and feedback means connected between said output terminal connected to said second transistor and said flip-flop circuit whereby selectively connecting different timing capacitors to said control electrode of said second transistor causes a change of slope without a corresponding change in amplitude of said sawtooth signal waves being generated.

2. An electrical circuit for selectively generating sawtooth signal waves having different slopes but same amplitudes comprising: first and second transistors each having base, emitter, and collector electrodes; means cross-connecting said base electrodes and said collector electrodes to provide a bistable circuit; a third transistor having base, emitter, and collector electrodes; means connecting said base electrode of said third transistor to said collector electrode of said first transistor; a fourth transistor having base, emitter, and collector electrodes, said base electrode of said fourth transistor being connected to said collector electrode of said third transistor; a timing resistor and a plurality of timing capacitors selectively connectable one each to said collector electrode of said third transistor; an output terminal connected to said emitter electrode of said fourth transistor; and feed-back means connected between said output terminal and said base electrode of said second transistor whereby selectively connecting different timing capacitors to said collector electrode of said third transistor causes a change of slope without a corresponding change in amplitude of said sawtooth signal waves being generated.

3. An electrical circuit for selectively generating sawtooth signal waves having different slopes but same amplitudes as set forth in claim 1 wherein said feedback means includes a capacitor and a unidirectional conducting device connected in series between said output terminal and said flip-flop circuit.

4. An electrical circuit for selectively generating sawtooth signal waves having different slopes but same amplitudes as set forth in claim 2 wherein said feedback means includes a capacitor and a unidirectional conducting device connected in series between said output terminal and said base electrode of said second transistor.

5. An electrical circuit for selectively generating sawtooth signal waves having different slopes but same amplitudes as set forth in claim 2 wherein said means connecting said base electrode of said third transistor to said collector electrode of said first transistor includes a speed up capacitor.

6. An electrical circuit for selectively generating sawtooth signal waves having different slopes but same amplitudes as set forth in claim 2 wherein said collector electrodes of said first, second, and third transistors are connected to positive bias potentials and said emitter electrodes of said first, second, and third transistors are connected to ground potential.

References Cited in the file of this patent

UNITED STATES PATENTS

| | | |
|---|---|---|
| 2,609,499 | Gilson | Sept. 2, 1952 |
| 2,661,421 | Talamini et al. | Dec. 1, 1953 |

OTHER REFERENCES

"Transistor Circuits," by Shea, page 51, pub. Wiley, September 15, 1953.